United States Patent Office 2,716,633

Patented Aug. 30, 1955

2,716,633

POLYMERIZABLE COMPOSITIONS

Vaughn Arthur Engelhardt, Claymont, Del., and Marvin Leroy Peterson, Woodbury, N. J., assignors to E. I. du Pont de Nemours & Company, Wilmington, Del., a corporation of Delaware

No Drawing. Application July 22, 1954, Serial No. 445,182

12 Claims. (Cl. 204—158)

This invention relates to polymerizable compositions and the polymerization thereof and, more particularly, to photopolymerizable compositions and their polymerization by irradiation with light.

It is well known that the polymerization of ethylenically unsaturated organic compounds such as the vinyl and vinylidene compounds, is catalyzed by light and that the rate of such photopolymerization is increased by certain compounds which are photoinitiators.

The most commonly used photoinitiators are the acyloins, particularly benzoin, which are disclosed in Agre U. S. Pat. 2,367,661.

The relatively longer times required for photopolymerization processes in comparison with other methods of polymerizing ethylenically unsaturated compounds, e. g,. by the use of free radical-liberating initiators, has retarded commercialization of photopolymerization processes. Further, the types of chemical compounds known to be photoinitiators is restricted and, particularly, specific compounds as active as benzoin in the role of photoinitiators have been unknown heretofore. Consequently, new types of photoinitiators are desired and, more especially, new photoinitiators as active or more active than benzoin are sought.

An object of the present invention is to provide new photoinitiators and a process of photopolymerization employing such photoinitiators. A further object is to provide new polymerizable compositions including such photoinitiators. A still further object is to provide new photoinitiators having an order of activity corresponding to or greater than that of benzoin. Other objects will be apparent from the description of the invention given hereinafter.

The above objects are accomplished according to the present invention by providing a composition comprising a photopolymerizable ethylenically unsaturated organic compound and, as a photoinitiator therefor, an O-alkyl xanthate ester in which the organic radical attached to the thiol sulfur atom of the xanthate structure $$\left(RO\overset{\overset{S}{\|}}{C}S-\right)$$

contains a double bond on the carbon atom in beta position to the thiol sulfur atom, the double bond being joined to a carbon or oxygen atom. The invention further comprises polymerizing such a composition by irradiating it with light.

It has been discovered that O-alkyl xanthate esters as defined above are quite unexpectedly efficient photoinitiators for the photopolymerization of polymerizable ethylenically unsaturated organic compounds in general. These esters can contain more than one xanthate ester group and more than one doubly bonded carbon in beta position with respect to the thiol sulfur atom.

The structure of a group of the photoinitiators of this invention which are of improved activity, is illustrated by the following general formula:

$$\left(RO\overset{\overset{S}{\|}}{C}S\right)_x C(H)_y(R')_z$$

wherein R is an alkyl radical, R′ is an organic radical whose free valence bond is on a carbon atom which is in turn connected by a double bond to an oxygen atom or to another carbon atom, $x$ and $z$ are positive integers from 1 to 2, inclusive, y is a positive integer from 0 to 2, inclusive, and the sum of $x+y+z$ equals 4.

A preferred group of the new photoinitiators of this invention is illustrated by the following formula:

$$\left(RO\overset{\overset{S}{\|}}{C}S\right)_x C(H)_y(COOR)_z$$

wherein R's are alkyl, which may be the same or different, and $x$ and $z$ are positive integers from 1 to 2, inclusive, $y$ is a positive integer from 0 to 2, inclusive, and the sum of $x+y+z$ equals 4. A still more preferred group of photoinitiators is the class represented by the formula $$\left(RO\overset{\overset{S}{\|}}{C}S\right)_x C(H)_y COOR$$

wherein the R's are alkyl radicals of 1 to 4 carbon atoms, inclusive, which may be the same or different, and $x$ and $y$ are positive integers from 1 to 2, inclusive, with the sum of $x+y$ being equal to 3.

The process of this invention can be carried out by any of the conventional photopolymerization techniques involving irradiation with light. Such methods include the bulk, emulsion, granular, and solution polymerization methods. In these methods the rates of polymerization obtained by the use of the preferred xanthate ester photoinitiators of this invention are fully comparable with or better than those obtainable with the conventional photoinitiator, benzoin.

In a preferred manner of carrying out this invention, a relatively small amount of the xanthate ester photoinitiator, e. g., from 0.1% to 2%, based on the weight of the ethylenically unsaturated monomer, is dissolved in the selected polymerizable ethylenically unsaturated compound and the solution is placed in a suitable reaction vessel which is then exposed to light, e. g., visible or ultraviolet light.

Since the rate of polymerization is approximately proportional to the amount of photoinitiator present, it is desirable to use a quantity of the xanthate ester sufficient to produce a practical rate of polymerization. For this reason, amounts ranging from 0.1% to 2% are preferred. Larger proportions, e. g. up to 10%, can be used, however, if desired.

The process of this invention is effective when the polymerization system is exposed to ultraviolet or visible light. Sources of light that are particularly useful include sunlight, mercury arcs, fluorescent light bulbs with special phosphors having maximum emission in the ultraviolet, and sun lamps of the type having both tungsten filaments and mercury arcs, which emit light in essentially all wave lengths down to 3000 Å units. The rate of polymerization is also proportional to the intensity of the light as well as to the proportion of the photoinitiator present. However, these factors can be readily controlled so as to obtain a satisfactory rate of polymerization.

Polymerizable ethylenically unsaturated compounds which are to be shipped or stored ordinarily have added to them a small amount of a thermal addition polymerization inhibitor, e. g., 0.01% to 0.1%, of hydroquinone based on the weight of the monomer. Such compositions can be photopolymerized by the O-alkyl xanthate esters of this invention without removal of the thermal polymerization inhibitor. Therefore, photopolymerizable compositions comprising the polymerizable ethylenically unsaturated monomer, a small amount of thermal polymerization inhibitor, and an O-alkyl xanthate ester of the type defined herein are part of this invention. Such compositions are a preferred embodiment of the invention since they are thermally stable and can be stored without change prior to photopolymerization.

The reaction vessels employed in carrying out the process of this invention can be either transparent to light or opaque. When transparent vessels are used, an external source of light can be employed, but opaque reactors require a light source inside the vessel. Reaction vessels suitable for use on a small scale are conveniently made of chemically resistant glass of the borosilicate type, such as "Pyrex."

The O-alkyl xanthate esters used as photoinitiators in the process of this invention can be prepared by conventional methods involving the reaction of alkali metal salts of xanthic acid with halogen compounds. For example, carbethoxymethylene bis(ethyl xanthate) can be made from ethyl dibromoacetate and potassium xanthate. Details of this reaction are given in French Patent 953,775 and German Patent 840,239.

The invention is further illustrated by the following examples in which the proportions of ingredients are expressed in parts by weight unless otherwise noted.

EXAMPLES 1–17

A "Pyrex" glass reaction tube is charged with two parts of purified methyl methacrylate (that is, methyl methacrylate from which thermal polymerization inhibitor has been removed) and 0.02 part of the particular O-alkyl xanthate ester photoinitiator being tested. The solution is flushed with nitrogen for three minutes and then frozen by surrounding the reaction tube with solid carbon dioxide. The tube is then evacuated, sealed, and irradiated at room temperature by the light from two 15-watt black light fluorescent tubes, which emit a substantial proportion of light of wave length ranging from 3200 to 3800 Å. units, and small amounts of light of wave length up to 6000 Å. units. The reaction tube is placed about one inch from the lights. The effectiveness of the initiator is determined by observing the time required for the monomer to polymerize to the gel point, and observing the condition of the polymer produced. The polymeric products are described as being hard or soft solids, or as viscous fluids. The specific O-alkyl xanthate esters tested in Examples 1–17 and the results obtained are summarized in Table I.

For purposes of comparison, there are also included in Table I the results of the photopolymerization of purified methyl methacrylate under the same conditions with the exception that (*a*) no photoinitiator is used, and (*b*) two O-alkyl xanthate esters which do not have a double bond on the carbon in the beta position to the thiol sulfur group of the xanthate ester, are used.

*Table I*

| Example No. | Initiator | Gelation Time (Hours) | Condition of the Polymer |
|---|---|---|---|
| 1 | Carbethoxymethylene bis(ethyl xanthate). | 1 | Hard. |
| 2 | Carbethoxymethylene bis(n-propyl xanthate). | 1 | Do. |
| 3 | Carbethoxymethylene bis(n-butyl xanthate). | 1 | Do. |
| 4 | Carbethoxymethyl n-propyl xanthate. | 1.5 | Do. |
| 5 | Dicarbethoxymethyl ethyl xanthate. | 1 | Do. |
| 6 | Dicarbethoxymethylene bis (ethyl xanthate). | 2.5 | Soft. |
| 7 | 1-Carbethoxy-1,2-ethylene bis (ethyl xanthate). | 1 | Hard. |
| 8 | 2-Thenyl ethyl xanthate | 1 | Do. |
| 9 | Benzyl n-propyl xanthate | 1 | Soft. |
| 10 | Allyl n-propyl xanthate | 1.5 | Hard. |
| 11 | 2 Butene-1,4-ylene bis(ethyl xanthate). | 1 | Do. |
| 12 | p-Xylylene bis(methyl xanthate). | 1 | Soft. |
| 13 | p-Xylylene bis(ethyl xanthate) | 1.5 | Hard. |
| 14 | p-Xylylene bis(n-propyl xanthate). | 1.5 | Do. |
| 15 | 2-Oxopropylene bis(methyl xanthate). | 1 | Do. |
| 16 | 2-Oxopropylene bis(ethyl xanthate). | 1 | Do. |
| 17 | Benzylidene bis(ethyl xanthate) | 1.25 | Soft. |
| | No initiator | >7 | Viscous fluid. |
| | Methyl ethyl xanthate | >7.5 | Do. |
| | Ethyl ethyl xanthate | 7.5 | Do. |

EXAMPLES 18–23

The rate of photopolymerization of an ethylenically unsaturated monomer can be measured with the oblique line refractometer by which the percentage polymerization can be determined through the change in refractive index. The construction and operation of the oblique line refractometer are described by Naylor and Billmeyer, J. Am. Chem. Soc. 75, 2181 (1935). The results of a photopolymerization rate study at 25° C. on specific photoinitiators of this invention in 0.2% concentration in purified methyl methacrylate are summarized in Table II, the procedure followed being the same as in Examples 1–17. There are also included in Table II, for purposes of comparison, the results obtained with purified methyl methacrylate under the same conditions with no initiator, and with the same percentage of benzoin, the most commonly used commercial photoinitiator.

*Table II*

| Example No. | Initiator | Percent Polymerization per Minute | Interval of Rapid Rate Increase to Complete Polymerization in Minutes After Start of Polymerization |
|---|---|---|---|
| 18 | Carbethoxymethylene bis(ethyl xanthate). | 0.45 | 75–90 |
| 19 | 2-Oxopropylene bis(ethyl xanthate). | 0.34 | 105–120 |
| 20 | 2-Oxopropylene bis(methyl xanthate). | 0.30 | 120–135 |
| 21 | 2-Thenyl ethyl xanthate | 0.30 | 120–135 |
| 22 | 2-Buten-1,4-ylene bis(ethyl xanthate). | 0.27 | 120–135 |
| 23 | Carbethoxyethylene bis(ethylxanthate). | 0.27 | 135–150 |
| | No initiator | 0 after 3 hours and 40 minutes irradiation. | |
| | Benzoin | 0.42 | 90–105 |

EXAMPLES 24–29

"Pyrex" glass reaction tubes are charged with 2 parts of purified methyl methacrylate and 0.02 part of O-alkyl xanthate ester initiator by the method of Example I. The sealed tubes are placed in a water-cooled box constructed of polymethyl methacrylate and irradiated, at a distance of four inches, with white light from a 500-watt projection bulb having a tungsten filament. This particular type of light bulb emits light of wave length ranging from 3200 to 7600 Å. units, with the bulk of the light being in the range 6000 to 7600 Å. The results of tests with specific initiators of this invention are summarized in Table III. This table also includes, for purposes of comparison, the results of photopolymerizations under the same conditions of purified methyl methacrylate with no initiator, with two O-alkyl xanthate esters which do not have double bonds attached to the carbon in the beta position with respect to the thiol sulfur atom of the xanthate group, and with benzoin.

*Table III*

| Example No. | Initiator | Gelation Time (Hours) | Condition of Polymer |
|---|---|---|---|
| 24 | Carbethoxymethylene bis (ethyl xanthate). | 2 | Hard. |
| 25 | Carbethoxymethylene bis (n-propyl xanthate). | 2 | Do. |
| 26 | Carbethoxymethylene bis (n-butyl xanthate). | 2 | Do. |
| 27 | 2-Thenyl ethyl xanthate | 3 | Do. |
| 28 | 1-Carbethoxy-1,2-ethylene bis (ethyl xanthate). | 3 | Do. |
| 29 | 2-Butene-1,4-ylene bis (ethyl xanthate). | 4 | Do. |
| | Benzoin | 3 | Do |
| | No initiator | >12 | Fluid. |
| | Methyl ethyl xanthate | >4 | Do. |
| | Ethyl ethyl xanthate | >4 | Do. |

EXAMPLE 30

A liquid photopolymerizable composition is prepared by adding 1 part of carbethoxymethylene bis(ethyl xanthate) to a liquid polymerizable mixture of 70 parts of poly(propylene glycol maleate/phthalate) and 30 parts of monomeric styrene. (This unsaturated monomer is a commercial material containing the usual small quantity of thermal polymerization inhibitor.) A layer of this liquid photosensitive composition 40 mils thick between glass plates is exposed to an ultraviolet light source consisting of three RS mercury vapor sun lamps and one S-4 mercury vapor sun lamp at distances of 10–16 inches from the composition on a horizontal turn table. The turn table is rotated at a speed of 4 R. P. M.; in two minutes the liquid composition is converted to a gel and in four minutes a firm sheet of polymer is obtained.

A photopolymerized relief image suitable for use as a printing plate is prepared from the liquid composition above, following the procedure disclosed in U. S. application Serial No. 326,841, filed December 19, 1952, by L. Plambeck, Jr. A steel base plate is primed with a pigmented polyvinyl butyral composition prepared as described in Example V of that application, and is coated with a methyl methacrylate anchor layer as described in Example VIII of that application. At the corners of this plate are arranged spacers 40 mils in thickness. The plate is then covered with a 40 mil layer of the photosensitive composition described above and a glass plate carrying a process transparency protected by a thin cellophane membrane is lowered into contact with the photosensitive layer so that the negative rests upon the spacers. The assembly is exposed to the ultraviolet light source described in the preceding paragraph for fifteen minutes. The negative is then removed and the unpolymerized areas of liquid on the plate are removed by washing the plate in an ethyl acetate/ethanol (87/13) mixture. An excellent relief image of the text on the negative is obtained.

The effectiveness of the O-alkyl xanthate esters of this invention as initiators of the photopolymerization of ethylenically unsaturated compounds containing the normal amount of thermal polymerization inhibitors is illustrated in Example 30 above. This is further illustrated below.

EXAMPLES 31 and 32

Table IV gives a summary of experiments showing comparisons on the photopolymerization of commercial methyl methacrylate containing the usual hydroquinone inhibitor and a purified methyl methacrylate from which the inhibitor has been removed, with carbethoxymethylene bis(ethyl xanthate) and with benzoin.

*Table IV*

| Example No. | Methyl Methacrylate | Initiator | Gelation Time (Minutes) | Condition of Polymer |
|---|---|---|---|---|
| 31 | Commercial | Carbethoxymethylene bis(ethyl xanthate). | 45 | Hard. |
| 32 | Purified | do | 40 | Do. |
| | Commercial | Benzoin | 51 | Do. |
| | Purified | do | 51 | Do. |

The polymerization conditions were the same as those used in Examples 1–17.

It will be understood that the above examples are merely illustrative and that the invention broadly resides in a composition comprising a photopolymerizable ethylenically unsaturated organic compound and, as a photoinitiator therefor, an O-alkyl xanthate ester in which the organic radical attached to the thiol sulfur atom of the xanthate structure contains a double bond on a carbon atom in beta position to the thiol sulfur atom, the double bond being joined to a carbon or oxygen atom, which composition may or may not contain a thermal addition polymerization inhibitor, and the process of preparing a polymeric product by irradiating such compositions with light.

In order to show more effectively the comparative rates of polymerization using various photoinitiators, methyl methacrylate has been used as the polymerizable organic compound in most of the examples. However, the instant invention is broadly applicable to photopolymerizable ethylenically unsaturated organic compounds in general as will be evident to those skilled in the art. Such polymerizable compounds include the acrylic, alpha-alkacrylic, and alpha-chloroacrylic acid compounds such as esters, amides, and nitriles, e. g., acrylonitrile, methacrylonitrile, ethyl acrylate, isobutyl methacrylate, methacrylamide, and methyl alpha-chloroacrylate; vinyl and vinylidene compounds such as vinyl and vinylidene esters, ethers, and ketones, e. g., vinyl propionate, vinyl chloride, vinylidene chloride, divinyl formal, and methyl vinyl ketone; and hydrocarbons having a terminal ethylenic linkage, e. g., styrene, isoprene, and chloroprene. Mixtures of two or more of these ethylenically unsaturated polymerizable compounds can also be polymerized by the process of this invention to form copolymers of various compositions.

The photoinitiators used in this invention are those O-alkyl xanthate esters in which the organic radical attached to the thiol sulfur atom of the xanthate structure contains a double bond on a carbon atom in beta position to the thiol sulfur atom, the double bond also being joined either to a carbon or oxygen atom.

In addition to the O-alkyl xanthate esters mentioned in the examples, others well adapted for use in the present invention include phenacyl, acetonyl, carbethoxymethyl and furfuryl ethyl xanthate; benzoylmethylene, acetylmethylene, benzal, furfural and thienylmethylene bis(ethyl xanthate); dibenzoylmethylene, diacetylmethylene, dicarbethoxymethylene, diphenylmethylene, difurylmethylene, and dithienylmethylene bis(ethyl xanthate); benzoylacetylmethylene, benzoylcarbethoxymethylene, benzoylphenylmethylene, benzoylfurylmethylene, and benzoylthienylmethylene bis(ethyl xanthate); acetylcarbethoxymethylene, acetylphenylmethylene, acetylfurylmethylene, and acetylthienylmethylene bis(ethyl xanthate); carbethoxyphenylmethylene, carbethoxyfurylmethylene, carbethoxythienylmethylene, phenylfurylmethylene, phenylthienylmethylene, and furylthienylmethylene bis(ethyl xanthate); furfuryl n-propyl xanthate; thenyl n-butyl xanthate; di(carbethoxy)methyl methyl xanthate; and di(furyl)methyl isopropyl xanthate.

The photoinitiators herein considered are effective despite the presence of any of the common thermal addition polymerization inhibitors which are used commercially in polymerizable monomers in small proportions, e. g., from 0.01% to 0.1% by weight of the monomer. Such inhibitors include, beside hydroquinone, tert.-butyl catechol, pyrogallol, copper resinate, naphthylamines, beta-naphthol, and the like.

The O-alkyl xanthate esters having a double bond attached to the carbon atom in the beta position to the thiol sulfur atom of the xanthate ester grouping are especially valuable as photoinitiators because of their activity. Those of the formula $$\left(\mathrm{RO}\overset{\displaystyle S}{\overset{\|}{\mathrm{C}}}\mathrm{S}\right)_x\mathrm{C(H)}_y\mathrm{(COOR)}_z$$

are especially valuable photoinitiators because of their improved activity. One of this group, viz., carbethoxymethylene bis-(ethyl xanthate), has greater activity as a photoinitiator than the most commonly employed initiator, benzoin. These initiators are particularly suitable for use in the polymerization of cements used in joining transparent articles and for the polymerization of ethylenically unsaturated compounds into shaped articles of excellent quality in short times. They are also of great value for initiating the photopolymerization of relief images suitable for use as printing plates.

As many apparently widely different embodiments of this invention may be made without departing from the spirit and scope thereof, it is to be understood that the invention is not limited to the specific embodiments thereof except as defined in the appended claims.

The invention claimed is:

1. A composition comprising a photopolymerizable ethylenically unsaturated organic compound and, as a photoinitiator therefor, from 0.1% to 10% of a compound of the formula $$\left(RO\overset{\overset{S}{\|}}{C}S\right)_x C(H)_y(R')_z$$

wherein R is an alkyl radical, $x$ and $z$ are positive integers from 1 to 2, inclusive, $y$ is an integer from 0 to 2, inclusive, the sum of $x+y+z$ equals 4, and R′ is an organic radical whose free valence bond is on a doubly bonded carbon atom, said double bond being joined to an atom of the group consisting of carbon and oxygen atoms.

2. A composition comprising a photopolymerizable ethylenically unsaturated organic compound and, as photoinitiator therefor, from 0.1% to 10% of a compound of the formula:

$$\left(RO\overset{\overset{S}{\|}}{C}S\right)_x C(H)_y(COOR)_z$$

wherein the R's are alkyl radicals, $x$ and $z$ are integers from 1 to 2, inclusive, $y$ is an integer from 0 to 2, inclusive, and the sum of $x+y+z$ equals 4.

3. A composition comprising a photopolymerizable ethylenically unsaturated organic compound and, as a photoinitiator therefor, from 0.1% to 10% of a carbalkoxymethylene bis(alkyl xanthate).

4. A composition comprising a photopolymerizable ethylenically unsaturated organic compound and, as a photoinitiator therefor, from 0.1% to 10% of a carbalkoxymethylene bis(alkyl xanthate).

5. A composition comprising a photopolymerizable ethylenically unsaturated organic compound and, as a photoinitiator therefor, from 0.1% to 10% of carbethoxymethylene bis(n-propyl xanthate).

6. A composition comprising a photopolymerizable ethylenically unsaturated organic compound and, as a photoinitiator therefor, from 0.1% to 10% of 2-thenyl ethyl xanthate.

7. A composition comprising a photopolymerizable ethylenically unsaturated organic compound and, as a photoinitiator therefor, from 0.1% to 10% of 2-oxopropylene bis(methyl xanthate).

8. A composition comprising a photopolymerizable ethylenically unsaturated organic compound and, as a photoinitiator therefor, from 0.1% to 10% of 2-oxopropylene bis(ethyl xanthate).

9. A composition comprising a photopolymerizable ethylenically unsaturated organic compound and, as a photoinitiator therefor, from 0.1% to 10% of carbethoxymethylene bis(ethyl xanthate).

10. A composition as set forth in claim 1, said composition containing 0.01% to 0.1%, by weight of said photopolymerizable organic compound, of a thermal addition polymerization inhibitor.

11. A composition as set forth in claim 10 wherein said inhibitor is hydroquinone.

12. Process of preparing polymers which comprises irradiating with light a composition as set forth in claim 1.

References Cited in the file of this patent

FOREIGN PATENTS 579,353 Great Britain ------------ July 31, 1946